(12) United States Patent
Roze et al.

(10) Patent No.: US 8,576,099 B2
(45) Date of Patent: Nov. 5, 2013

(54) DIGITAL-TO-ANALOG CONVERTER (DAC) WITH COMMON MODE TRACKING AND ANALOG-TO-DIGITAL CONVERTER (ADC) FUNCTIONALITY TO MEASURE DAC COMMON MODE VOLTAGE

(75) Inventors: Robert Roze, Fort Collins, CO (US); Ronnie E. Owens, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/365,291

(22) Filed: Feb. 3, 2012

(65) Prior Publication Data

US 2013/0201041 A1 Aug. 8, 2013

(51) Int. Cl.
*H03M 9/00* (2006.01)

(52) U.S. Cl.
USPC .......................................... 341/100; 341/101

(58) Field of Classification Search
USPC .................................. 341/100, 101; 330/258
See application file for complete search history.

(56) References Cited

U.S. PATENT DOCUMENTS

| 4,609,906 | A | | 9/1986 | Wiegel |
| 5,880,690 | A | * | 3/1999 | Rothenberg ................... 341/161 |
| 5,963,156 | A | * | 10/1999 | Lewicki et al. ............... 341/122 |
| 6,492,922 | B1 | | 12/2002 | New |
| 6,573,779 | B2 | * | 6/2003 | Sidiropoulos et al. ........ 327/345 |
| 6,771,127 | B2 | * | 8/2004 | Mulder et al. ................. 330/258 |
| 7,741,981 | B1 | | 6/2010 | Wan et al. |

FOREIGN PATENT DOCUMENTS

| EP | 0797305 A1 | 9/1997 |
| GB | 2370434 A | 6/2002 |

* cited by examiner

*Primary Examiner* — Brian Young

(57) ABSTRACT

A circuit includes a first circuit portion operable as a digital-to-analog converter (DAC) for generating a DAC common mode voltage signal (outp), a second circuit portion having a comparator for comparing the DAC common mode voltage (outp) against a received signal common mode voltage (vsumdc), the comparator providing a single bit output, and a single bit register configured to receive the single bit output of the comparator, the single bit output used to control a feedback circuit, the feedback circuit configured to control the DAC common mode voltage signal.

20 Claims, 5 Drawing Sheets

US 8,576,099 B2

DIGITAL-TO-ANALOG CONVERTER (DAC) WITH COMMON MODE TRACKING AND ANALOG-TO-DIGITAL CONVERTER (ADC) FUNCTIONALITY TO MEASURE DAC COMMON MODE VOLTAGE

BACKGROUND

A modern application specific integrated circuit (ASIC) must meet very stringent design and performance specifications. One example of an ASIC is a circuit element referred to as a serializer/deserializer (SERDES). As its name implies, a SERDES converts a parallel bit stream to a high speed serial bit stream, transmits it across a channel, then the serial bit stream is converted back to a parallel bit stream. A typical SERDES is organized into blocks of transmitters and receivers having digital to analog conversion (DAC) functionality and analog to digital conversion (ADC) functionality. Normally, the receivers and transmitters operate on differential signals. Differential signals are those that are represented by two complementary signals on different conductors, with the term "differential" representing the difference between the two complementary signals. All differential signals also have what is referred to as a "common mode," which represents the average of the two differential signals.

In a SERDES receiver, it is desirable to observe one or more voltages within the receiver architecture. One of the voltages sought to be observed is the receiver's common mode voltage. Unfortunately, observing voltages inside of a SERDES receiver is difficult because of the limited availability of pins through which to observe the desired signals.

FIG. 1 is a schematic diagram illustrating an existing digital to analog converter (DAC) that may be part of a SERDES receiver, configured to perform common mode tracking on a differential input signal. The DAC 1 comprises a first DAC 2 and a second DAC 4. For example purposes only, the first DAC 2 receives digital input signals on connection 6. The digital input signal on connection 6 typically comprises a multi-bit wide (parallel) stream and can be referred to as the positive (p) or true (T), component of a differential input signal. The second DAC 4 receives digital input signals on connection 7. The digital input signal on connection 7 typically comprises a multi-bit wide (parallel) stream and can be referred to as the negative (n) or complement (C) component of a differential input signal. During normal operation, the differential signals are always complementary so that together they output a differential signal, centered around the common mode that the rest of the circuit tracks. The output of the DAC 2 on connection 11 is a single value analog version of the digital input signal on connection 6, and the output of the DAC 4 on connection 12 is a single value analog version of the digital input signal on connection 7.

The signal on connection 11 is provided to a resistor 8 and the signal on connection 12 is provided to a resistor 9. The resistors 8 and 9 respectively illustrate the output impedance of the DAC 2 and the DAC 4. A supply voltage Vcc is provided to resistor 14 to generate the positive output signal "outp" on connection 17. The supply voltage Vcc is provided to resistor 16 to generate the negative output signal "outn" on connection 18. The output signal, outp, on connection 17 is generated by a current 19 flowing through a current source 23 and the output signal, outn, on connection 18 is generated by a current flowing in connection 21 through a current source 24.

A common mode DAC output signal referred to as "Vcm_out" is provided to an operational amplifier 30 on connection 35. A SERDES receiver's filtered common mode signal, referred to as "vsumdc" is provided to the operational amplifier 30 on connection 41. The common mode DAC output signal Vcm_out is generated by taking the outp signal on connection 17 and the outn signal on connection 18 and combining them through respective resistors 32 and 34 to generate the common mode DAC output signal connection 35. Similarly, the receiver's common mode signal, vsumdc, on connection 41 is generated by taking the differential receiver inputs vsum1 (or RXin1) and vsum2 (or RXin2) on connections 36 and 37, and processing them through respective resistors 38 and 39, to develop the receiver's filtered common mode signal on connection 41. The output of the operational amplifier 30 is controlled by the difference between Vcm_out and vsumdc, and tends to drive the nodes outp 17 and outn 18 toward the value of vsumdc. The resistors 8 and 9, the resistors 14 and 16, and the current sources 19 and 21 allow the outp and outn signals to have an adjustable common mode, that can track the vsum1, vsum2 common mode, vsumdc. The resistor network also allows the DAC output to be attenuated, so that it has a range that is closer to the range expected at vsum1 and vsum2

FIG. 2 is a schematic diagram illustrating the DAC of FIG. 1 in additional detail. Elements in FIG. 2 that are identical to corresponding elements in FIG. 1 are identically numbered. The DAC 51 illustrates the operational amplifier 30 of FIG. 1 in additional detail. The operational amplifier 30 comprises a first stage having transistors 52 and 54, a second stage having transistors 61, 62, 66 and 67, and current sources 58 and 59 arranged in what is referred to as a folded cascode architecture.

The Vcm_out signal on connection 35 is provided to the gate of transistor 52 and the vsumdc signal on connection 41 is provided to the gate of transistor 54. When conducting, the transistors 52 and 54 steer a current generated by the current source 55. The drain 56 of the transistor 52 is coupled to the source of transistor 61. The drain 57 of the transistor 54 is coupled to the source of transistor 62. The gates of transistors 61 and 62 are biased by a bias voltage signal Vg on connection 64. The transistor 66 is configured as a diode. Depending on the values of Vcm_out and vsumdc, current flows through the current sources 58 and 59, creating the above-mentioned output on connection 31. The output of the operational amplifier 30 on connection 31 is provided to a resistor 69 and a capacitor 72, which form a high impedance dominant pole at node 71. The resistor 69 and capacitor 72 need not necessarily be separate components in the circuit, and are shown to illustrate that the output of the operational amplifier 30 is at a high impedance, and the gates of the transistors 74 and 75 have a large capacitance. Therefore, the high impedance at node 71 acts like a large resistive/capacitive (RC) circuit, which stabilizes the loop.

The current source shown graphically in FIG. 1 using reference numeral 23 is represented by an n-type metal oxide semiconductor (NMOS) transistor 74. The current source shown graphically in FIG. 1 using reference numeral 24 is represented by an NMOS transistor 75. The positive output outp is shown on connection 17, and the negative output outn is shown on connection 18.

Accordingly, the DAC 51 that exists in a SERDES receiver currently has access to the incoming receiver differential signals. Therefore, what is needed is a way of using the information provided by the operational amplifier 30 to measure the DAC common mode voltage.

SUMMARY

In an embodiment, a circuit includes a first circuit portion operable as a digital-to-analog converter (DAC) for generating a DAC common mode voltage signal (outp), a second circuit portion having a comparator for comparing the DAC common mode voltage (outp) against a received signal common mode voltage (vsumdc), the comparator providing a single bit output, and a single bit register configured to receive the single bit output of the comparator, the single bit output used to control a feedback circuit, the feedback circuit configured to control the DAC common mode voltage signal.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A digital to analog converter (DAC) with common mode tracking and analog to digital converter (ADC) functionality can be implemented in a SERDES or another circuit to measure DAC common mode voltage.

Figure 3:
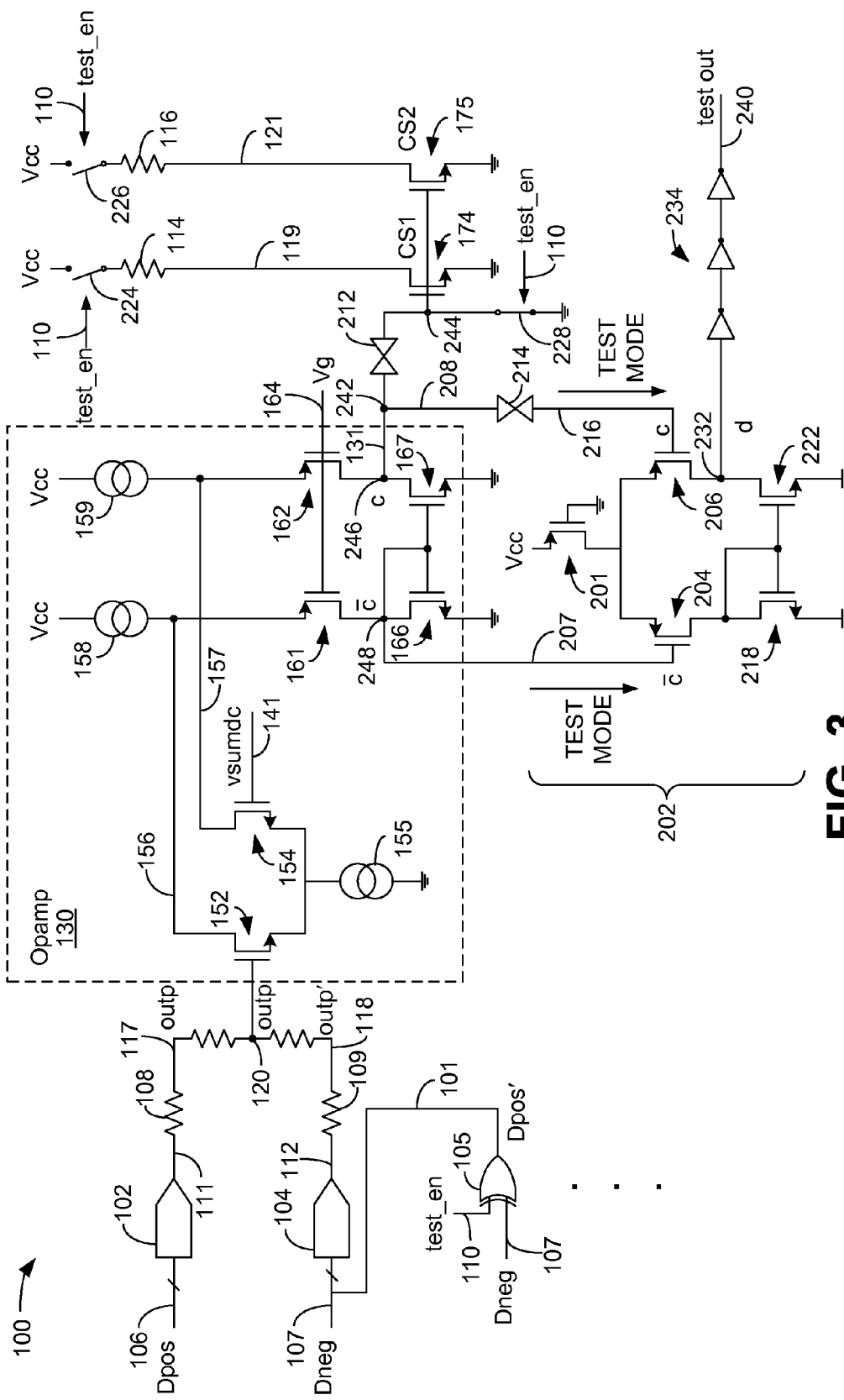
FIG. 3 is a schematic diagram illustrating an embodiment of circuit using a DAC and a comparator to form an analog to digital converter (ADC).

FIG. 3 is a schematic diagram illustrating an embodiment of a circuit 100 using a DAC and a comparator to form an analog to digital converter (ADC). The circuit 100 can be implemented on an ASIC, on a SERDES, and more particularly, in the receiver section of a SERDES on an application specific integrated circuit (ASIC).

Figure 1:
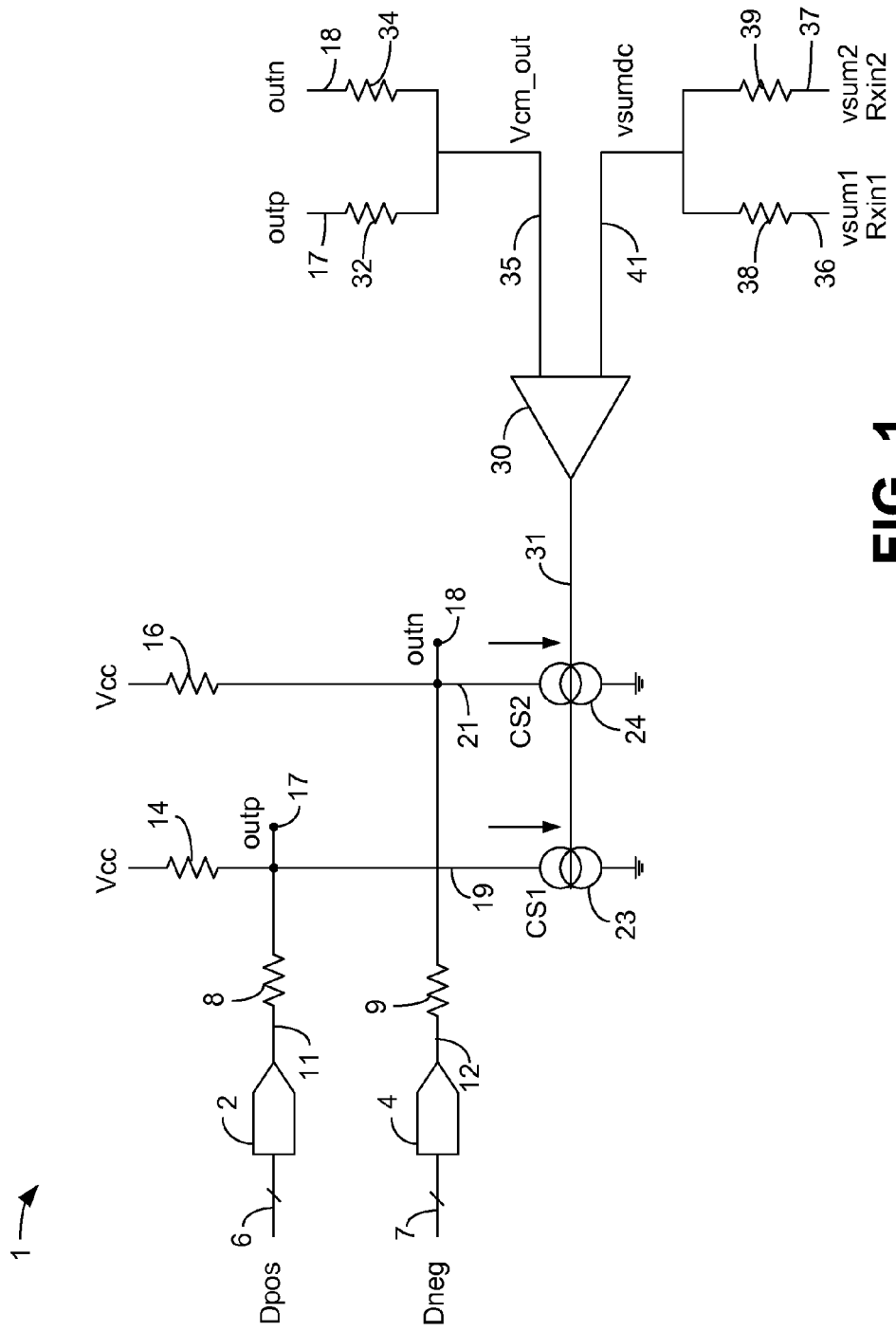
FIG. 1 is a schematic diagram illustrating an existing digital to analog converter (DAC) that may be part of a SERDES receiver, configured to perform common mode tracking on a differential input signal.
Figure 2:
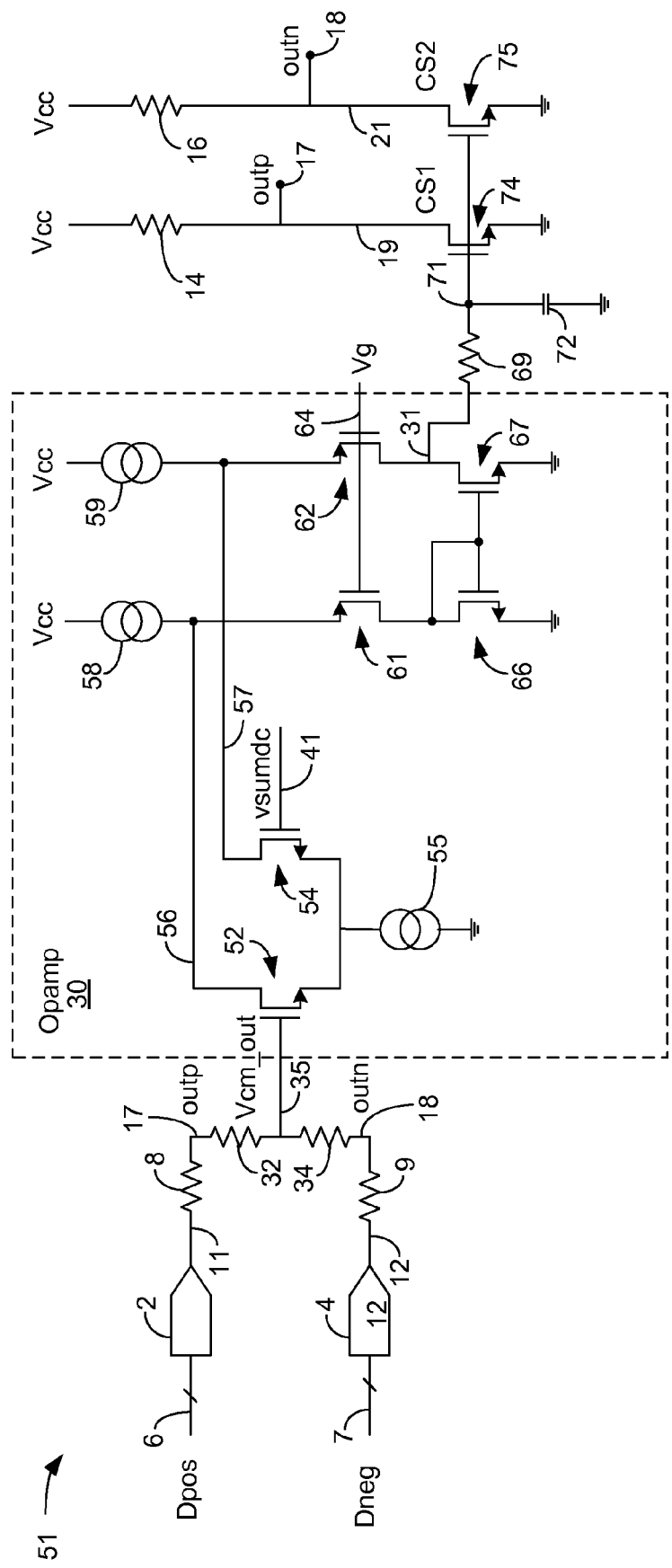
FIG. 2 is a schematic diagram illustrating the DAC of FIG. 1 in additional detail.

To measure the DAC common mode voltage vsumdc, the circuit 100 provides a single-ended signal representing the DAC input. An example of a circuit that can provide this single-ended signal representing the DAC input is exclusive OR (XOR) logic, an example of which is illustrated using reference numeral 105. One such logic assembly would be implemented for each bit of DAC resolution, with an exemplary single logic gate 105 illustrated in FIG. 3 for simplicity. The logic gate 105 receives a digital input on connection 107, the digital input being the negative DAC input, Dneg, and receives a test enable signal, test_en, supplied on connection 110. The signal Dneg is the digital complement of the signal Dpos, and under normal operation, test_en is logic low, and the value of Dneg is passed to connection 101 unchanged. This causes the outp and outn nodes 17 and 18 (FIG. 2) be driven to a differential voltage proportional to the value of the D signals on connections 106 and 107, and centered around the common mode voltage, vsumdc on connection 141. In order to measure the vsumdc common mode voltage, the test_en bit is set high. This causes each XOR logic gate 105 to act as an inverter for the Dneg bit, so that the output on connection 101 is set to the inverse of Dneg, which is referred to as Dpos' to differentiate it from Dpos although Dpos and Dpos' have the same value. Therefore, when the test_en signal is logic high, both DACs 102 and 104 receive the same digital input value, Dpos and Dpos', and thus drive the same analog output, outp, on connection 120. This manipulation of Dneg is implemented so that a single-ended signal representing the DAC input appears at node 120.

The circuit 100 comprises a DAC 102 configured to receive the positive input signal, Dpos. The positive input signal, Dpos, is the positive, or true portion of the differential signal on connection 106. The output of the DAC 102 on connection 111 is provided through a resistor 108 to provide an output signal outp on connection 117. The circuit 100 also comprises a DAC 104 configured to receive the negative input signal, Dneg, unless the test mode is enabled, in which case the DAC 104 receives the signal Dpos' from the logic gate 105 over connection 101, as described above. The output of the DAC 104 on connection 112 is provided through a resistor 109 to provide an output signal outp' on connection 118. The signal outp' on connection 118 has the same value as the signal outp on connection 117, but is differentiated from outp because it is generated by the signal Dpos' provided by the logic gate 105 while in test mode. The output signal outp on connection 117 and the output signal outp' on connection 118 are combined at node 120 form a single ended signal outp that is applied to the gate of the transistor 152.

The receiver common mode signal, vsumdc, is provided over connection 141 to the gate of the transistor 154. The drain 156 of the transistor 152 is coupled to a current source 158 and to the source of transistor 161. The drain 157 of the transistor 154 is coupled to a current source 159 and to the source of the transistor 162. The gates of transistors 161 and 162 are biased by a bias voltage signal Vg on connection 164. It should be mentioned that although described using field effect transistor (FET) technology, the transistor devices described herein can be implemented using other transistor technologies, such as, for example but not limited to, bipolar junction transistor (BJT) technology, other variants of FET technology, and other switching technologies.

The circuit 100 also includes switches 224, 226 and 228, which are each controlled by the test enable signal, test_en, on connection 110. The switch 224 is used to connect and disconnect resistor 114, and transistor 174 from system voltage, Vcc. The switch 226 is used to connect and disconnect the resistor 116, and the transistor 175 from system voltage, Vcc. When placed into a test mode, both of the transistors 174 and 175 are disabled by opening the switches 224 and 226. Similarly, when placed in test mode, the switch 228 is closed, thereby grounding the respective gates of the transistors 174 and 175. Closing the switch 228 also causes the output of the operational amplifier 130 at node 131 to be supplied to a comparator 202. The comparator 202 comprises transistors 201, 204, 206, 218 and 222, and functions as a differential to single-ended converter. A transmission gate (also referred to as a "T" gate) 212 is used between the node 242 and the node 244. A transmission gate 214 is used between the node 242 and the gate of the transistor 206 on connection 216. In regular operation, the transmission gate 212 is made conductive, and the transmission gate 214 is made non-conductive. This configuration allows the output of the operational amplifier 130 to drive the gates of the transistors 174 and 175, to pull the output common mode, outp, of the DAC 100 to the intended target, vsumdc.

In test mode, the transmission gate 212 is made non-conductive, the transmission gate 214 is made conductive, and the switch 228 shorts the gates of the transistors 174 and 175 to ground. This disables the common mode tracking function of the operational amplifier 130. The transmission gate 214 connects the output of the operational amplifier on connection 208 to connection 216 to form one input to the comparator 202.

When set in test mode, the comparator 202 is used to compare the voltage at node 246, which is applied to the gate of the transistor 206, with the voltage at node 248, which is applied to the gate of the transistor 204, and provide an output at node 232. When in test mode, the transmission gate 214 allows the output of the operational amplifier 130 at node 246 to propagate to connection 216, which is one input of the comparator 202. The other comparator input at node 248, is already connected to the complementary output of the amplifier at node 248. The output of the comparator 202 on connection to 232 is a result of the difference between the voltages at nodes 246 and 248. For example, if the value of vsumdc (which is the voltage appearing at node 246) is greater than the value of outp (which is the voltage appearing at node 248, then the voltage at node 232 will be a single ended signal, the value of which changes in a direction other than if the value of vsumdc is less than the value of outp. If the voltage at connection 141, vsumdc, is greater than the voltage at node 120, outp, then node 232 will go high. If vsumdc is lower than outp, then node 232 will go low.

The output of the comparator 202 is provided over connection 232 to a series of one or more inverters 234, which buffer the output signal and provide a digital test_out signal on connection 240. The voltage at node 232 might not reach completely to Vcc or to GND, so the buffers 234 ensure a clean digital signal at connection 240.

Figure 4:
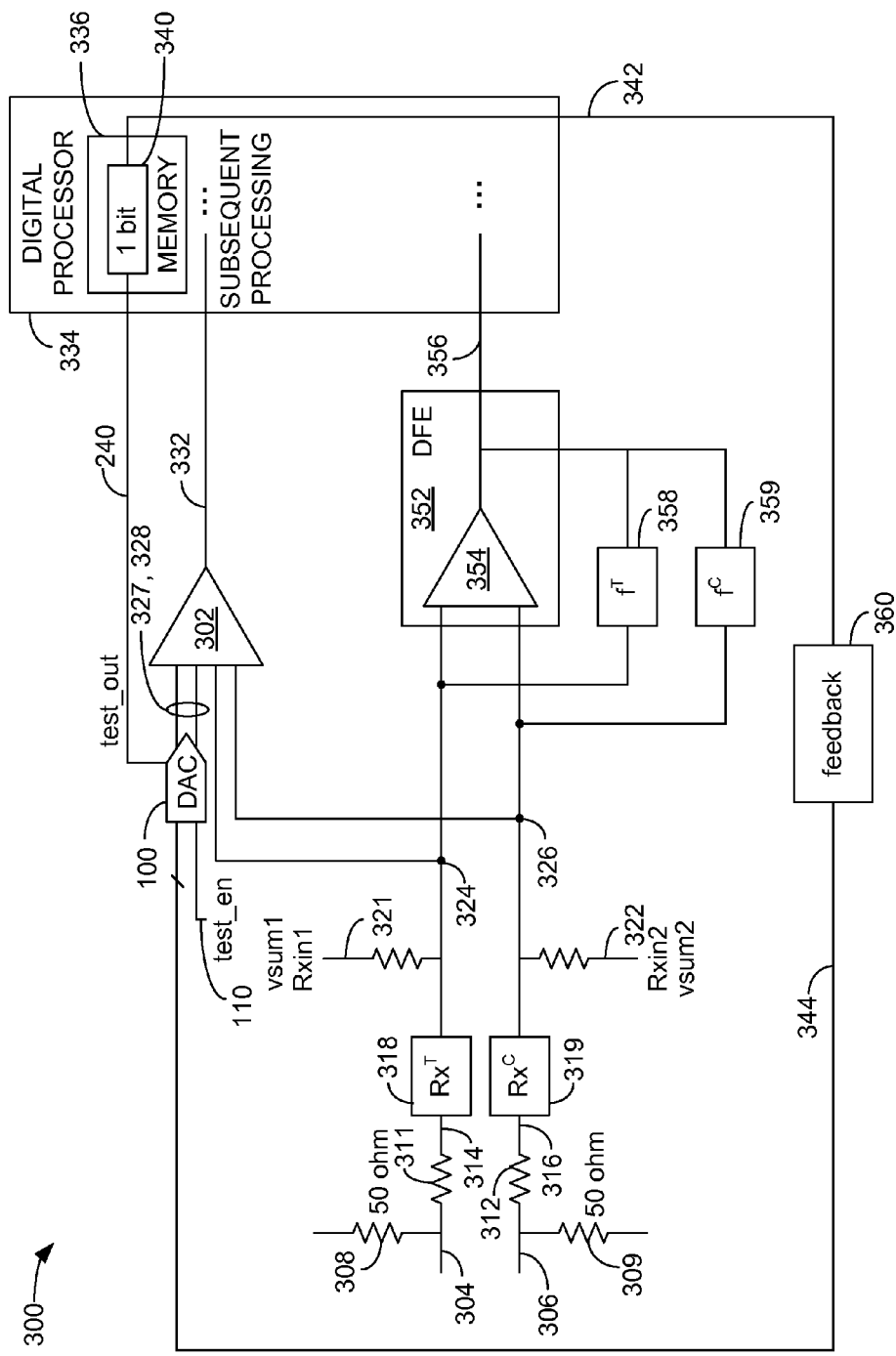
FIG. 4 is a block diagram illustrating a portion of a SERDES receiver including the circuit of FIG. 3.

FIG. 4 is a block diagram illustrating a portion of a SERDES receiver 300. The SERDES receiver portion shown in FIG. 4 comprises one channel of a SERDES receiver.

A differential input signal is provided over connections 304 306. The resistors 308 and 309, which can be implemented as 50 ohm termination devices, create a termination impedance to terminate the differential input signal. The differential signal component on connection 304 is provided through a resistor 311 and provided to a receive element 318, $Rx^T$. The superscript "T" refers to a true or positive component of the differential input signal. The differential signal component on connection 306 is provided through a resistor 312 and provided to a receive element 319, $Rx^C$. The superscript "C" refers to a complementary or negative component of the differential input signal.

A first component of a differential receive signal (vsum1 or Rxin1) is provided over connection 321. A second component of a differential receive signal (vsum2 or Rxin2) is provided over connection 322. The first component of the differential receive signal at node 324 is provided to one input of a dual differential comparator 302 while the second component of the differential receive signal connection 326 is provided to another input of a dual differential comparator 302. The dual differential comparator 302 also receives the output of the circuit 100 (FIG. 3) as differential inputs 327 and 328. The test enable signal, test_en, on connection 110 and the test_out signal on connection 240 are illustrated in FIG. 4 for reference.

The differential input signals on connections 324 and 326 are also provided to a decision feedback equalizer (DFE) 352. The DFE comprises a slicer 354. The slicer 354 amplifies the differential input signal on connections 324 and 326 and provides an output on connection 356, which is provided to a digital processor 334. The digital processor 334 provides subsequent processing as known in the art and which will not be described in greater detail. The output of the decision feedback equalizer 352 is also provided to a weighting factor 358 and to a weighting factor 359. The weighting factors 358 and 359 provide feedback coefficients for the true (T) and complement (C) versions of the output of the slicer 356 and are provided back to the input of the slicer 354, as known in the art. The output of the dual differential comparator 302 is also provided to the digital processor 334 for subsequent processing, as known in the art.

In accordance with an embodiment, the test output signal 240 from the circuit 100 is provided to a 1-bit register 340 that is located within a memory element 336. The memory element 336 and the 1-bit register 340 can be any memory element known to those skilled in the art. The output of the 1-bit register 340 is provided over connection 342 to a feedback element 360. The feedback element 360 can execute processing configured to adjust the input value of the circuit 100, as will be described in greater detail below. The output of the feedback element 360 is provided over connection 344 as an input to the circuit 100.

Figure 5:
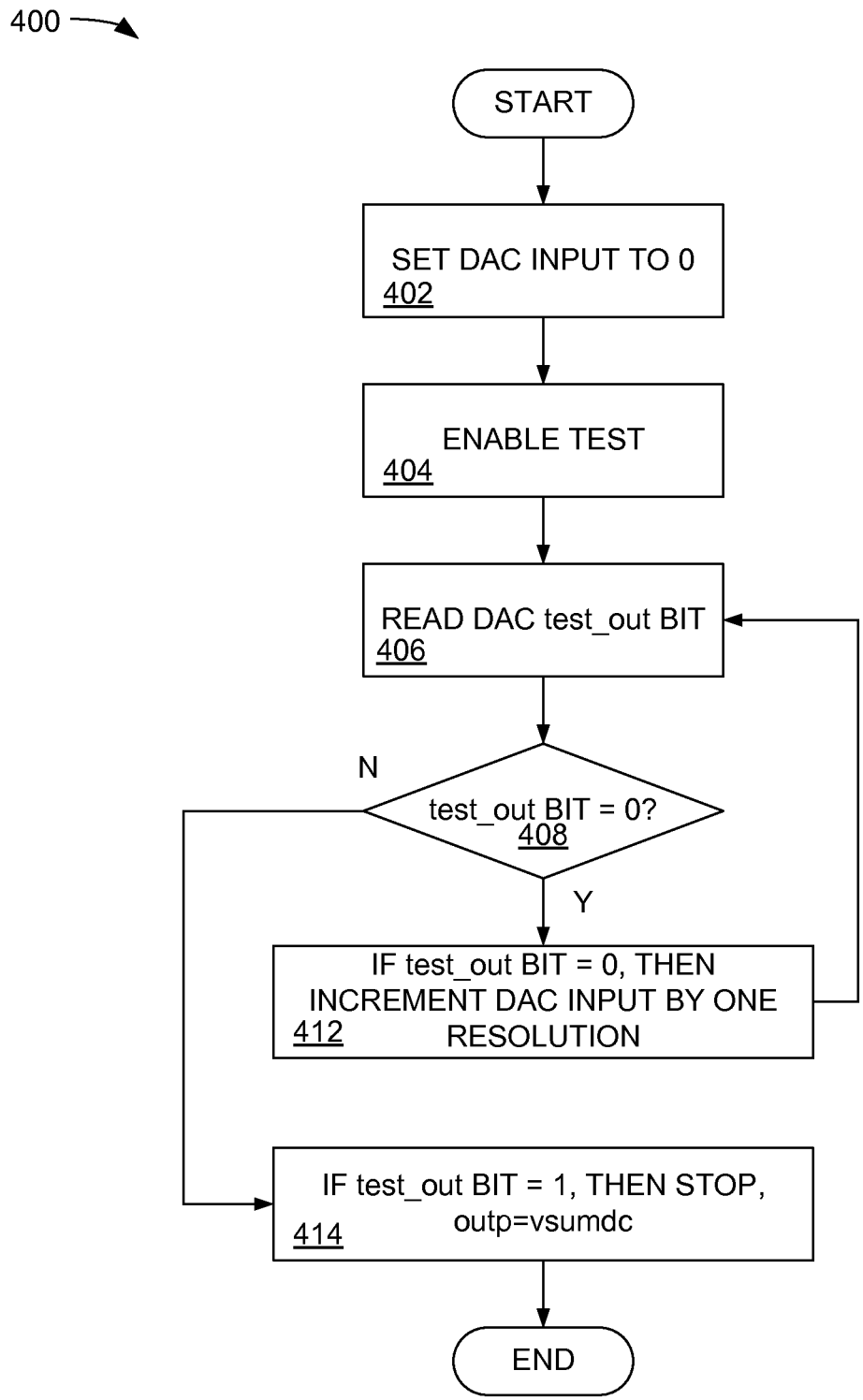
FIG. 5 is a flowchart describing the operation of an embodiment of the processing and logic applied by the feedback element of FIG. 4.

FIG. 5 is a flowchart describing the operation of an embodiment of the processing and logic applied by the feedback element 360 of FIG. 4.

In block 402, the DAC input to the circuit 100 of FIG. 3 is set to zero. This refers to setting the circuit 100 of FIG. 3 to have a zero voltage input at connections 106 and 107.

In block 404, the test mode is activated by setting the test_en signal to set the circuit 100 of FIG. 3 into test mode. This causes the logic gate 105 and the switches 224, 226 and 228 to be responsive to the test_en signal on connection 110. This also causes the transmission gate 212 to become non-conductive and the transmission gate 214 to become conductive.

In block 406, the test_out bit on connection 240 is read out of the 1-bit register 340.

In block 408 it is determined whether the test_out bit has a value of zero. If the test out bit has a value of zero, then, in block 412, the DAC input is incremented by one DAC resolution. The DAC resolution refers to the number of bits that the DAC is configured to process. In the example described herein, the circuit 100 implements a nine bit DAC, and therefore the circuit 100 has a resolution of nine bits. In this manner, the single bit output causes the feedback circuit 360 to drive the common mode, outp, of the differential input signal toward the received signal common mode voltage, vsumdc. The process then returns to block 406.

If, in block 408 is determined that the test_out bit value is not equal zero (i.e., is equal to 1), then, in block 414, the process ends and the value of outp equals the value of vsumdc (FIG. 3).

This disclosure describes the invention in detail using illustrative embodiments. However, it is to be understood that the invention defined by the appended claims is not limited to the precise embodiments described.

What is claimed is:
1. A circuit, comprising:
a first circuit portion operable as a digital-to-analog converter (DAC) for generating a DAC common mode voltage (outp);
a second circuit portion having a comparator for comparing the DAC common mode voltage (outp) against a received signal common mode voltage (vsumdc), the comparator providing a single bit output; and
a single bit register configured to receive the single bit output of the comparator, the single bit output used to control a feedback circuit, the feedback circuit configured to control the DAC common mode voltage signal.

2. The circuit of claim 1, further comprising logic (xor) configured to convert a differential input signal to a single ended signal representing the common mode input to the DAC.

3. The circuit of claim 1, wherein the single bit output causes the feedback circuit to increase an input value to the DAC when the value of the single bit signal changes in a first direction.

4. The circuit of claim 1, wherein the single bit output causes the feedback circuit to decrease an input value to the DAC when the value of the single bit signal changes in a direction opposite the first direction.

5. The circuit of claim 1, wherein the DAC common mode voltage is derived from a differential input signal and the single bit output causes the feedback circuit to drive the common mode of the differential input signal toward the received signal common mode voltage (vsumdc).

6. A method for operating a circuit, comprising:
converting a differential input signal to a single-ended common mode voltage (outp) using a digital-to-analog converter (DAC);
comparing the single-ended common mode voltage (outp) against a received signal common mode voltage (vsumdc) using a comparator, the comparator providing a single bit output corresponding to the comparing of the single ended common mode voltage (outp) and the received signal common mode voltage (vsumdc);
receiving the single bit output in a single bit register; and
using the single bit output to control the single-ended common mode voltage (outp).

7. The method of claim 6, further comprising converting a differential input signal to a single ended signal representing the common mode input to the DAC using a logic gate.

8. The method of claim 6, wherein the single bit output causes an increase in the single-ended common mode voltage (outp) when the value of the single bit signal changes in a first direction.

9. The method of claim 6, wherein the single bit output causes the feedback circuit to decrease an input value to the DAC when the value of the single bit signal changes in a direction opposite the first direction.

10. The method of claim 6, wherein the single-ended common mode voltage (outp) is derived from a differential input signal and the single bit output causes the single-ended common mode of the differential input signal to move toward the received signal common mode voltage (vsumdc).

11. A serializer/deserializer (SERDES), comprising:
a first circuit portion operable as a digital-to-analog converter (DAC) for generating a DAC common mode voltage (outp);
a second circuit portion having a comparator for comparing the DAC common mode voltage (outp) against a received signal common mode voltage (vsumdc), the comparator providing a single bit output; and
a single bit register configured to receive the single bit output of the comparator, the single bit output used to control a feedback circuit, the feedback circuit configured to control the DAC common mode voltage.

12. The SERDES of claim 11, further comprising logic (xor) configured to convert a differential input signal to a single ended signal representing the common mode input to the DAC.

13. The SERDES of claim 11, wherein the single bit output causes the feedback circuit to increase an input value to the DAC when the value of the single bit signal changes in a first direction.

14. The SERDES of claim 11, wherein the single bit output causes the feedback circuit to decrease an input value to the DAC when the value of the single bit signal changes in a direction opposite the first direction.

15. The SERDES of claim 11, wherein the DAC common mode voltage (outp) is derived from a differential input signal and the single bit output causes the feedback circuit to drive the common mode of the differential input signal toward the received signal common mode voltage (vsumdc).

16. The circuit of claim 1, wherein the first circuit portion comprises a common mode tracking circuit when in other than a test mode to draw the DAC common mode voltage (outp) to the received signal common mode voltage (vsumdc).

17. The circuit of claim 2, wherein the logic (xor) and the second circuit portion are operable in a test mode.

18. The method of claim 7, further comprising operating the logic gate and the comparator in a test mode.

19. The SERDES of claim 11, wherein the first circuit portion comprises a common mode tracking circuit when in other than a test mode to draw the DAC common mode voltage (outp) to the received signal common mode voltage (vsumdc).

20. The SERDES of claim 12, wherein the logic (xor) and the second circuit portion are operable in a test mode.

* * * * *